United States Patent [19]

Tezuka et al.

[11] Patent Number: 4,851,902
[45] Date of Patent: Jul. 25, 1989

[54] AUTOMATIC INSPECTION SYSTEM FOR IC LEAD FRAMES AND VISUAL INSPECTION METHOD THEREOF

[75] Inventors: Junichi Tezuka; Takaaki Kishi; Yasuto Murata, all of Kanagawa, Japan

[73] Assignee: Electroplating Engineers of Japan, Limited, Tokyo, Japan

[21] Appl. No.: 82,097

[22] Filed: Aug. 5, 1987

[30] Foreign Application Priority Data

Oct. 29, 1986 [JP] Japan .......................... 61-165081[U]
Feb. 6, 1987 [JP] Japan .................................. 62-24844
Feb. 6, 1987 [JP] Japan .................................. 62-24845
Apr. 3, 1987 [JP] Japan .................................. 62-80887

[51] Int. Cl.⁴ ............................................. H04N 7/18
[52] U.S. Cl. .................................... 358/101; 358/106; 382/8; 209/577
[58] Field of Search ...................... 358/101, 106, 107; 209/525, 526, 577; 382/8

[56] References Cited

U.S. PATENT DOCUMENTS 4,578,810 3/1986 MacFarlane et al. .......... 358/106 X
4,579,455 4/1986 Levy et al. ...................... 358/106 X
4,668,982 5/1987 Tinnerino ........................ 358/106 X
4,737,845 4/1988 Susaki et al. ......................... 382/8 X

OTHER PUBLICATIONS

IC Lead Frame Inspection Unit Catalog.
Cognex 2000 Machine Vision Catalog ©1986.
TR—1L Catalog, Mar. 1985.

Primary Examiner—James J. Groody
Assistant Examiner—Victor R. Kostak
Attorney, Agent, or Firm—Flynn, Thiel, Boutell & Tanis

[57] ABSTRACT

The system includes a visual inspection unit, a plating thickness inspection unit, and a shape inspection unit, suitably arranged in combination on the inspection line for automatic inspection of stains, flaws, glossiness or deformation in plated IC lead frames. The system can be used by an inventive method to correct errors in positional relation between a reference image and images input from an inspection camera, to obtain a comparison between a reference luminance curve and the individual luminance curves and the correlation between reflectivity and the corresponding area, and to obtain a comparison between the reference correlation and individual correlations to thereby enhance automation and precision in inspection IC lead frames.

11 Claims, 13 Drawing Sheets

500A ~ H; measure point

4,851,902

AUTOMATIC INSPECTION SYSTEM FOR IC LEAD FRAMES AND VISUAL INSPECTION METHOD THEREOF

This invention relates to an automatic inspection system for IC lead frames and a visual inspection method for IC lead frames to be used with the system.

BACKGROUND OF THE INVENTION

In the prior art, plated IC lead frames are visually inspected for stains, flaws, glossiness, deformations, etc. in the final finishing stage. As the precision in such a visual inspection largely depending on the skill, experience, physical conditions and other human factors of individual inspectors and fluctuates widely, there has been much demand for an improvement. As remarkable progress was made in recent years in various optical devices, automatic performance of visual inspections became possible. One of the examples of these achievements was shown by the visual inspection system discussed in "Shoryoku to Jidoka (Laborsaving and Automation)", pp. 43-44, July, 1985; Ohm Publication House.

As electronic technology has been improved to a remarkable degree in recent years, the demand for ICs as well as for IC lead frames increased, which inevitably enhanced the significance of the efficiency of IC lead frame manufacture as well as that of inspection for plated IC lead frames at the final finishing stage.

BRIEF SUMMARY OF THE INVENTION

This invention was devised to obviate the defects encountered in the prior art. This invention aims to provide an automatic inspection system for IC lead frames which can perform inspections of IC lead frames with a higher efficiency and a visual inspection method for IC lead frames to be used with the above system.

The above and other objects and features of this invention will become clearer upon reading the following description and claims taken in conjunction with the attached drawings.

DESCRIPTION OF THE PREFERRED EMBODIMENTS

Figure 1:
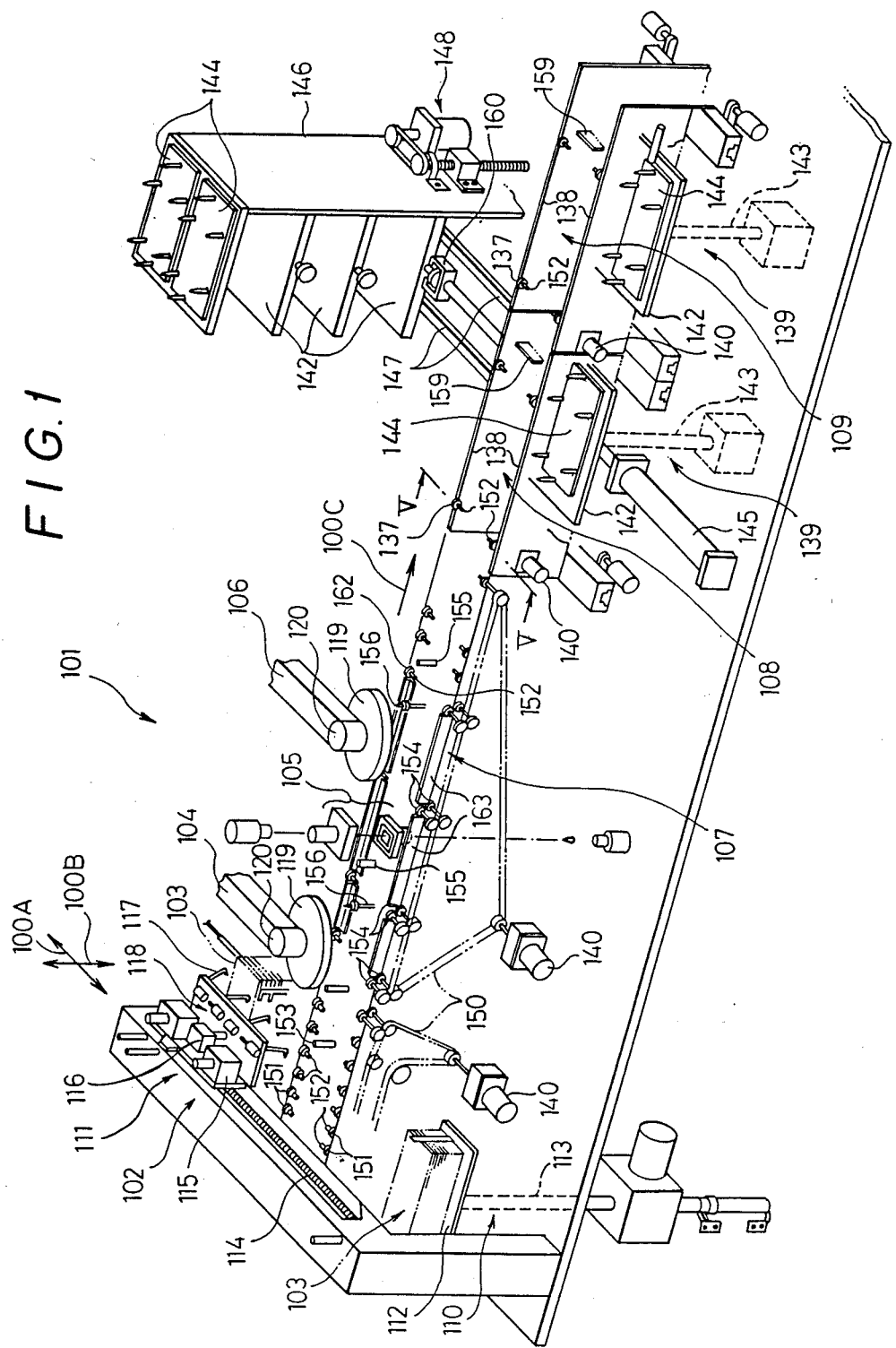
FIG. 1 is a schematic perspective view of an embodiment of the automatic inspection system for IC lead frames according to this invention.
Figure 2:
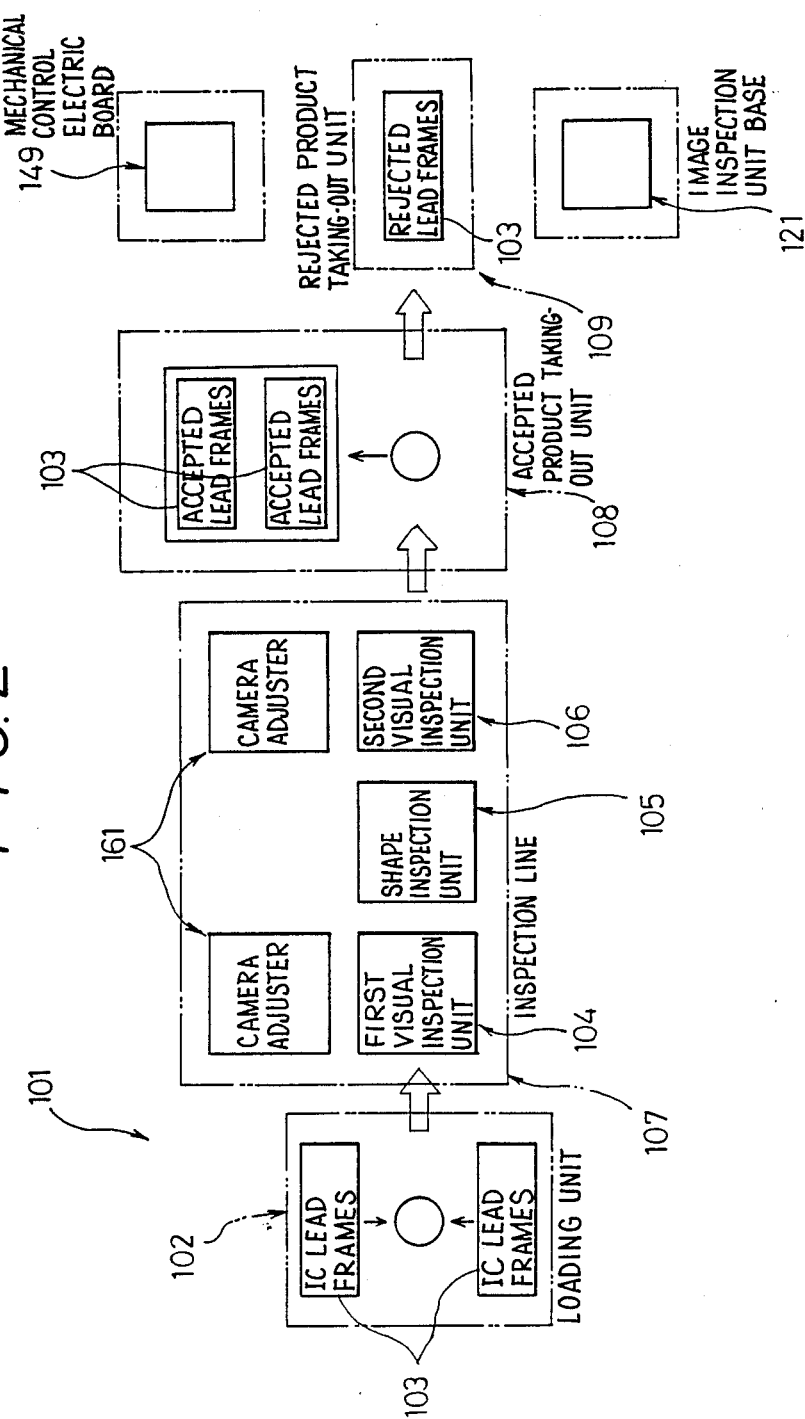
FIG. 2 is a schematic view of the inspection process shown in FIG. 1.
Figure 3:
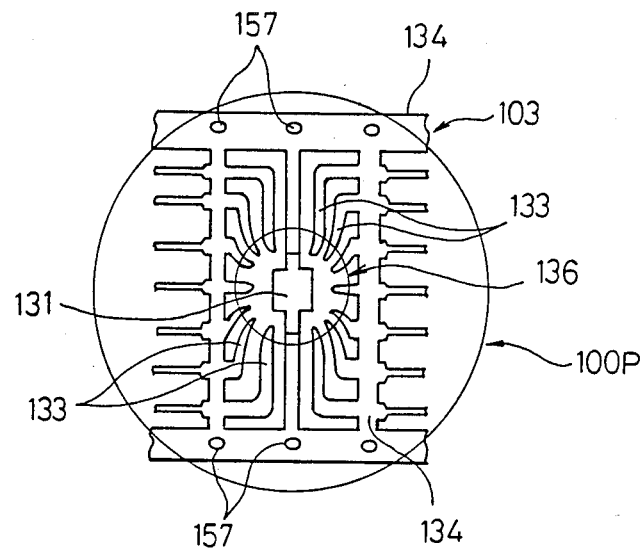
FIG. 3 is a schematic plan view of the scope of inspection on an IC lead frame at the visual inspection system.

This invention will now be described by referring to the attached drawings. FIGS. 1 through 5 are the views to show the first embodiment of this invention.

The automatic inspection unit 101 for IC lead frames 103 comprises a loading unit 102 arranged at the input side, a first visual inspection unit 104 which inspects the patterned shapes of IC lead frames 103, a shape inspection unit 105 which detects deformation of lead frames 103, a second visual inspection unit 106 which inspects the appearance of the plated products, an accepted-product-taking-out unit 108 which takes out accepted products from the inspection line 107, and a rejected-product-taking-out unit 109 which takes out rejected products from the inspection line 107.

The loading unit 102 moves IC lead frames 103 one by one from a pile thereof to the inspection line 107, and comprises a mount 110 and a chucking device 111. The mount 110 is to carry IC lead frames 103 thereon and to keep the height of the topmost lead frame 103 substantially the same as the inspection line 107 by a suitable means. The mount 110 is adapted to freely move a table 112 upward/downward with an elevation cylinder 113. The chucking device 111 comprises a supporting member 115 which is freely movable horizontally in the direction [in the direction of an arrow 100A] perpendicular to the direction of the inspection line 107 with a feed screw 114 which is movable by a driving means (not shown) and a chucking claw member 118 provided with chucking claws 117 which is movable in the vertical direction [in the direction of an arrow 100B] by a compact cylinder 116 in order to hold a lead frame one by one.

The first visual inspection unit 104 comprises an irradiation means 119 which emits light onto an IC lead frame which is the object of the inspection, a TV camera 120 which picks up patterned images of the IC lead frame 103 out of the reflected light and an image inspection unit base 121; and is used to compare and analyze the images for each IC obtained from the TV camera with the reference image of a normal IC lead frame 103 which is stored in advance in order to discriminate acceptable patterned shapes from defective shapes.

Figure 4:
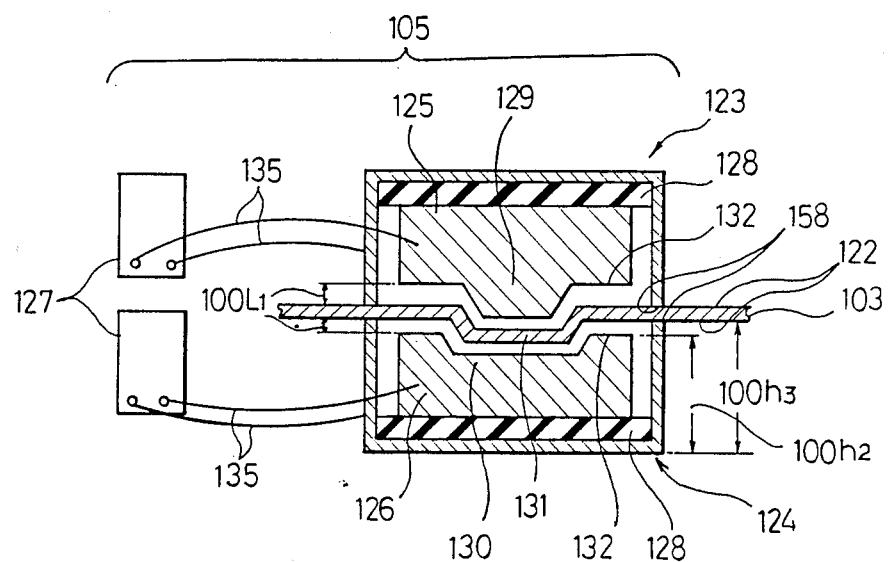
FIG. 4 is a cross section of a shape inspection unit.

Referring to FIG. 4, the shape inspection unit 105 comprises a pair of cases 123, 124 which holds an IC lead frame 103 from both sides 122, a pair of conductive contacts 125, 126 which are respectively placed within the cases 123, 124 in insulation correspondingly for detecting deformation in IC lead fraames 103, and a connection detector 127 which connects the cases 123, 124 with the contacts 125, 126 for detecting connection of electric current.

The upper case 123 and the lower case 124 are made of a conductive material in the form of box.

The contact 125 is arranged in the upper case 123 via an insulating plate 128, and has a projected portion 129 while the contact 126 is arranged in the lower case 124 via an insulating plate 128 and has a recessed portion 130. The contacts 125, 126 are configured in consideration of the shapes of an island member 131 and the marginal values of deformation in IC lead frames 103 so that a normally shaped or non-deformed IC lead frame 103 may pass without contact through a minute interval $100L_1$ formed between the contacts 125 and 126. The height $100h_2$ of both contacts 125, 126 or the distance from the bottom to the flat part thereof 132 is made smaller than the height $100h_3$ of the cases 123, 124 on both sides so that the contacts 125, 126 are prevented from contacting an inner lead 133 and a frame 134 of the IC lead frame 103.

The connection detector 127 detects electric connection when a circuit is formed by deformation of the IC lead frame 103 between the lead frame and one of the contacts by electric wire 135 for connecting the case 123 with the contact 125 (or the case 124 with the contact 126). The detection of electrical connection mentioned above may be performed by connecting the pole of the side connected with both cases 123, 124 with either one of rollers 162 and a guide 163 which support the IC lead frame 103 which is in contact with the cases 123, 124.

The second visual inspection unit 106 comprises an irradiation means 119 similar to the one for the first visual inspection unit 104, a TV camera 120, and an image detector base 121, and performs comparison and analysis of plates area 136 of each IC 100P with the reference image of the plated object 136 which is stored in advance in order to discriminate acceptable products from defective products on account of their appearance.

An accepted-product-taking-out device 108 comprises rollers 137 for transporting IC lead frames 103, side plates 138 which are arranged to oppose each other and are adapted to support the rollers 137 and move freely in the directions vertical as well as perpendicular to the direction of the inspection line 107 with a driving means (not shown) and a mounting table 139 which houses lead frames 103.

Figure 5:
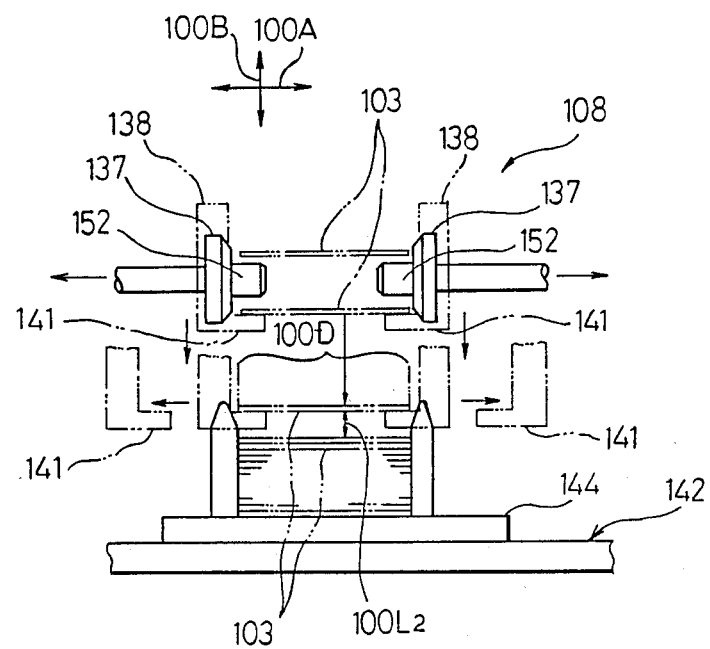
FIG. 5 is a cross section to show the operation of a device for taking out accepted products, taken along the line V—V in FIG. 1.

Referring to FIGS. 1 and 5, the rollers 137 are rotatable and movable in the direction perpendicular to the inspection line 107 by motors 140 arranged on both sides and longitudinal direction of the inspection line 107 [the direction indicated with an arrow 100C]. The side plates 138 are bent at the lower ends thereof toward the inspection line 107 to form receivers 141. The mounting table 139 carries the IC lead frames 103 thereon, keeps the interval $100L_2$ constant between the topmost lead frame 103 and the lead frame 103 on the receiver 141 of the side plate 138. The table 142 for carrying IC lead frames 103 is made vertically movable with an elevating cylinder 143. The table 142 is provided with two bases 144 for storage of IC lead frames 103.

A lateral cylinder 145 and a stocker 146 are provided perpendicularly to the direction of the inspection line 107 wherein the lateral cylinder 145 moves the table 142 with the bases 144 mounted thereon on rails 147 close to the receptive position 100D while the stocker 146 is adapted to freely move in vertical direction by a driving means 148 to facilitate storage of the table 142 and alteration thereof, and further moves another table 142 to the height corresponding to the height of the lateral cylinder 145.

The rejected-product-taking-out device 109 has the same structure as said acceptable-product-taking-out device 108 except that it can take out rejected IC lead frames out of the inspection line 107 with signals either from the first and second visual inspection units 104, 106 or the shape inspection unit 105.

The reference numeral 149 denotes a mechanical control electric board which operates and controls the acceptable- and rejected-products-taking-out devices 108, 109 while the reference numeral 161 denotes a camera adjuster. The reference numeral 162 denotes rollers which are arranged to oppose pinch rollers 154 which will be described later and are rotated as the pinch rollers 154 rotate. The reference numeral 163 denotes guides which guide IC lead frames for conveying the same.

Description will now be given to the automatic inspection method for the automatic inspection system for IC lead frames.

The loading unit 102 holds one IC lead frame 103 with the chucking claws 117 and moves the same onto the inspection line 107. The mount 110 moves the table 112 slightly upward to bring the topmost IC lead frame 103 to the height substantially the same as the inspection line 107 by the elevating cylinder 113.

The IC lead frames 103 move on the axis 152 of the rollers 151 which are rotated by a motor 140 via a belt 150 until they contact a stopper sensor 153 and are then aligned at the advancing end. While an end of an IC lead frame 103 is held between pinch rollers 154 which are rotated by the motor 140 via the belt 150 and the other end thereof is placed on the axis of the rollers 162 which is rotated as the IC lead frame 103 moves, the IC lead frame is advanced. The transportation of the IC lead frames 103 from the first visual inspection unit 104 to the second visual inspection unit 106 is synchronized while one end of the IC lead frame 103 is held with pinch rollers 154 and the other end thereof is placed on the axis 152 of the rollers 162.

When the IC lead frame moves to contact a stopper sensor 155 in the first visual inspection unit 104, positioning pins 156 are moved upward to be engaged within guiding hole 157 of the IC lead frame 103 so as to set the initial position. At the first visual inspection unit 104, light is emitted onto the IC lead frame 103 by an irradiation means 119, and the reflected light is caught by a TV camera 120 to pick up images of the whole IC portions 100P of an IC lead frame 103 respectively to compare and analyze their images with the reference image by an image inspection unit base 121 for their patterned shapes and to determine acceptance or rejection of the products.

Then, the IC lead frame 103 is centered at the center of the island portion thereof 131 with the centers of the contacts 125, 126 respectively, and is held between the cases 123, 124.

The frame portion 134 of the IC lead frame 103 comes to abut against the faces 158 of the cases 123, 124 so as to maintain the non-contact state with the contacts 125, 126.

If a particular IC lead frame 103 is not deformed, it does not contact the contact 125 or 126 as there is a minute interval therebetween, but if another particular IC lead frame is deformed beyond the marginal value, it inevitably contacts either the projection 129 or the recess 130 to form an electrical circuit extending from the case 123, 124 (or from the roller 162 and the guide 163) to the lead frame 103 and the contacts 125, 126. In this case, the electrical connection is detected by a connection detector 127. This arrangement enables precise and simultaneous detection of deformations beyond the marginal value existing both in the frame portion 134 and the island portion 131.

Then, the IC lead frame 103 is advanced to the second visual inspection unit 106 and the initial position thereof is set by engaging the positioning pins 156 into the guiding holes 157 in a manner similar to the positioning at the first visual inspection unit 104, the reflected light is caught by a TV camera 120, images of the plated portion 136 of each IC portion 100P of the lead frame 103 is intermittently but consecutively picked up to be compared and analyzed with the reference images by the image inspection unit base 121 thereby discriminating acceptable products from defective ones. The resolution of the second visual inspection unit is higher than that of the TV camera 120 at the first visual inspection unit 104 so as to enable minute inspection.

The IC lead frame 103 which has passed through the first and second visual inspection units 104, 106 and arrived at the acceptable-product-taking-out device 108 is suspended at a stopper 159 and taken out as an acceptable product unless it is detected of any defect or abnormality. When the rollers 137 recede in the direction perpendicular to the direction of the line, and the side plates 138 lower, the IC lead frame 103 is lowered to be received at the receiving section 141 of the side plate 138, and when the receiving section 141 is further lowered, the side plates 138 further recede to release the IC lead frame 103 which drops down to a determined position on the base 144 to be stored. The elevating cylinder 143 slightly lowers so as to maintain the interval between the lead frame on the receiving section 141 and the topmost lead frame 103 on the base 144 constant.

When any defect or abnormality is detected by any of the inspection units 104, 105, and 106, the IC lead frame 103 is stopped at the stopper 159 after having passed through the acceptable-product-taking-out device 108 and is taken out from the line to the base 144 in an operation similar to the one described for the acceptable-product-taking-out device 108. The aforementioned visual inspection and shape inspection can be performed repeatedly and automatically at a high efficiency as described in the foregoing statement.

When said inspections are repeatedly conducted, and accepted IC lead frames 103 are stored up to the maximum capacity of the two bases 144, the lateral cylinder 145 pushes the table 142 to store the same within a stocker 146. The stocker 146 moves vertically to release the engagement between the lateral cylinder 145 and the table 142, and newly engages another table 142 with the engaging section 160 of the lateral cylinder 145 and pulls the table 142 to the receiving position 160 so as to store the lead frames 103 thereon.

The arrangement of the first and second visual inspection units 104, 106 and the shape inspection unit 105 are by no means limited to the above described arrangement, and the first and second visual inspection units 104, 106 may be formed as one integral unit.

The automatic inspection system according to this invention having the aforementioned structure can achieve the following effects:

(A) As all the visual inspections on plated portions and the inspection of the overall shape can be automatically performed on line, the inspection precision and efficiency of the overall process can be remarkedly enhanced compared with the aforementioned mechanical inspection as well as the prior art visual inspection.

(B) As the images on the inspection objects are compared with the reference images which are stored in advance for analysis, the precision and efficiency in the inspection for patterned shape and plating appearance of IC lead frames can be increased remarkably.

(C) As deformation of an IC lead frame can be detected from the electrical connection through contacts in this invention shape inspection unit, deformation in shapes can be easily detected at higher precision and efficiency without the need for destroying the IC lead frames.

(D) One IC lead frame is held between the cases on both sides in this invention shape inspection, the deformation or abnormality in both the island portion and the frame portion can be simultaneously detected to thereby further improve the inspection efficiency.

(E) According to the preferred embodiments of this invention, as the IC lead frame is held between pinch rollers while it is conveyed within the guide in synchronization, the positional displacement of the inspection object from scope of the inspection never occurs.

Figure 6:
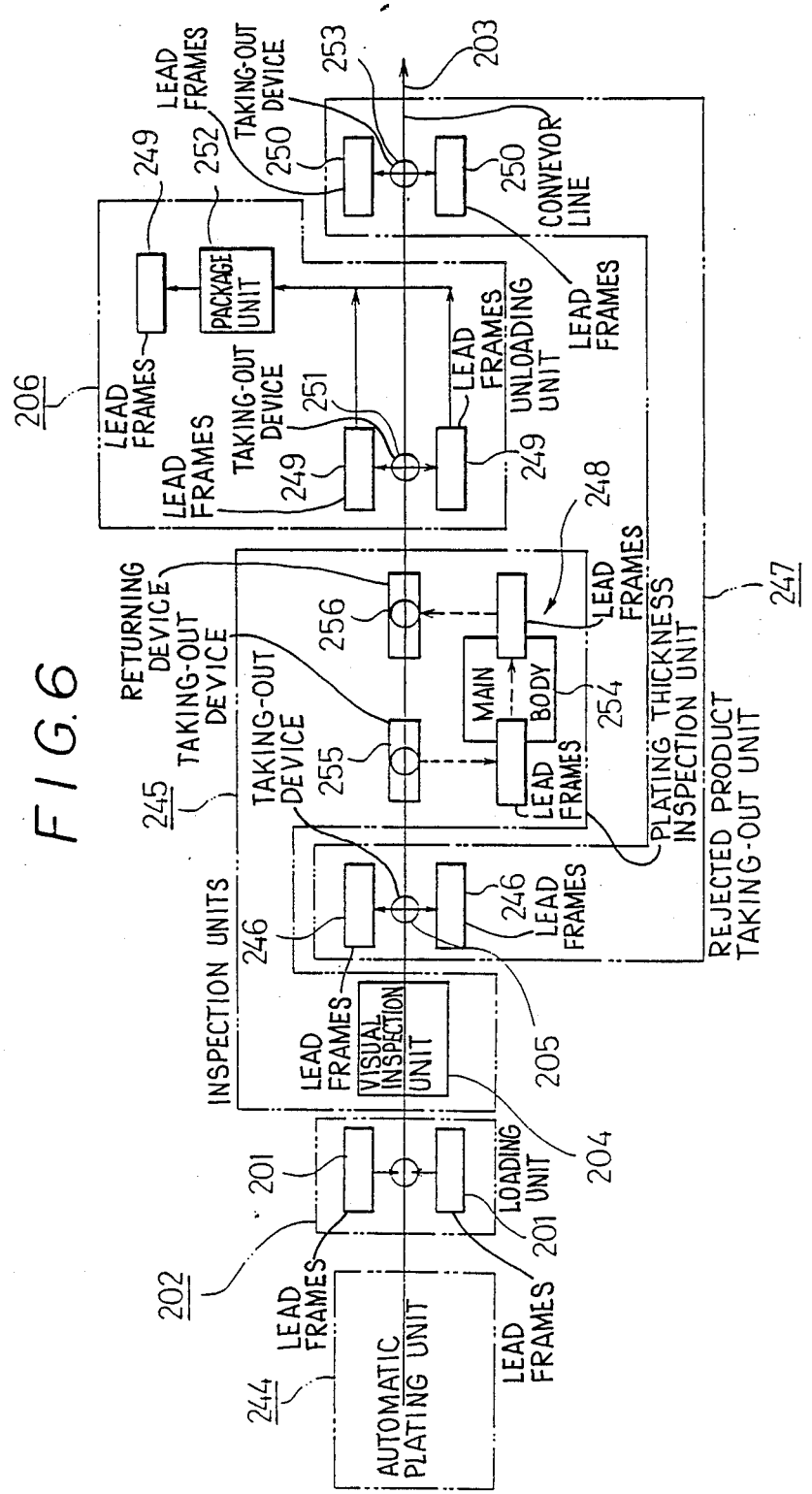
FIG. 6 is a schematic explanatory view to show the whole process of the automatic inspection unit for IC lead frames according to an embodiment of this invention.
Figure 7:
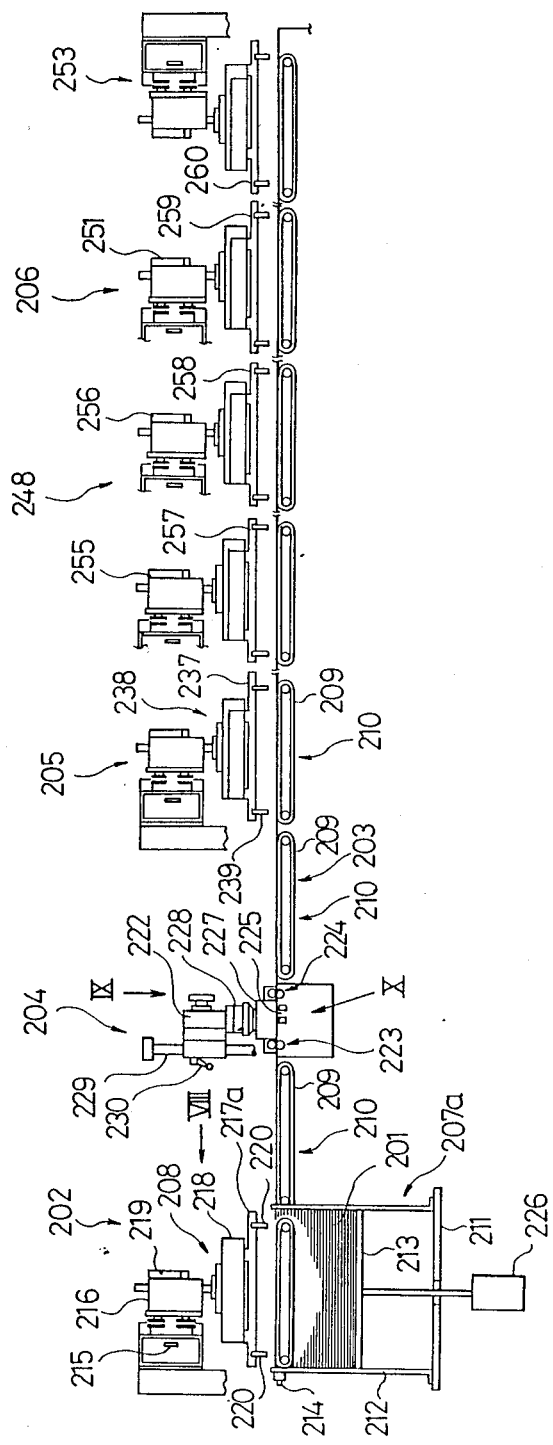
FIG. 7 is a schematic side view of the automatic inspection unit for IC lead frames shown in FIG. 6.
Figure 8:
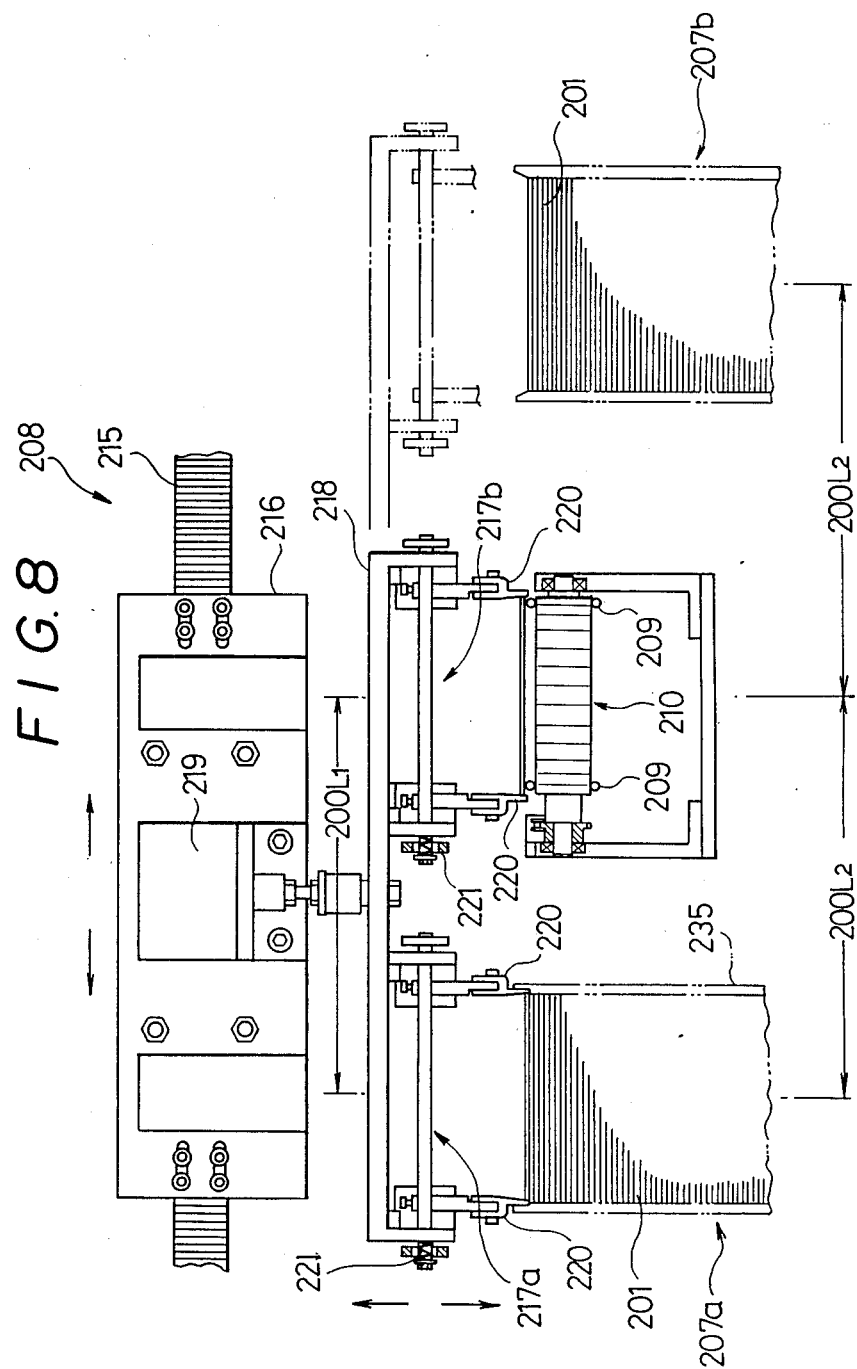
FIG. 8 is a side view of a loading unit viewed from the direction of the arrow VIII in FIG. 7.
Figure 9:
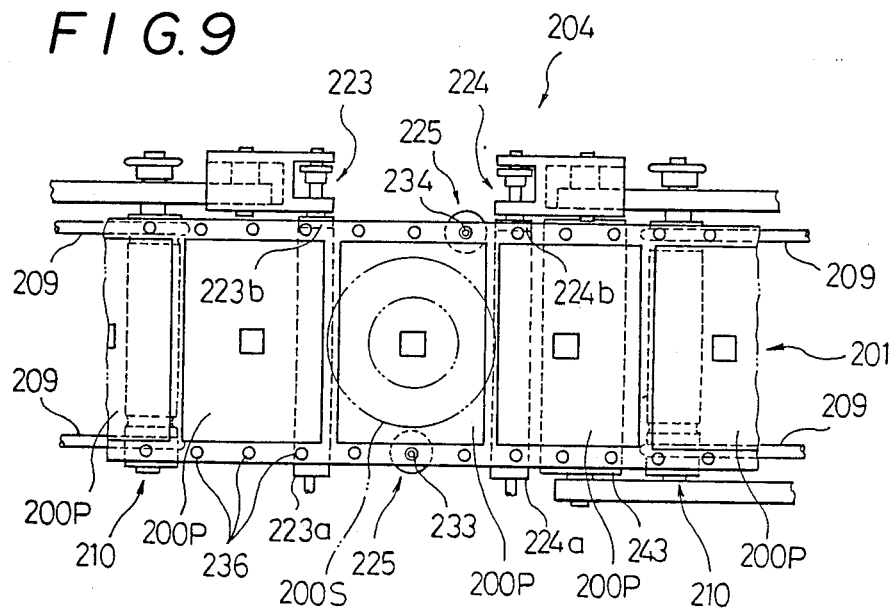
FIG. 9 is a plan view of an inspection stage of the visual inspection unit viewed from the direction of the arrow IX in FIG. 7.
Figure 10:
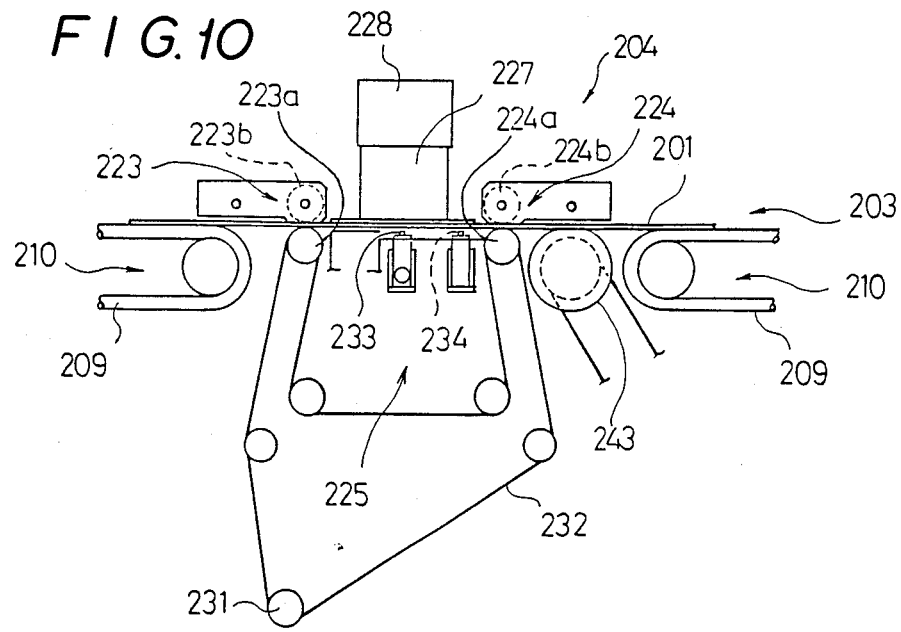
FIG. 10 is an enlarged side view of pinch rollers for feeding-in/taking-out and a positioning mechanism marked with the arrow X in FIG. 7.

The second embodiment will now be described by referring to FIGS. 6 through 10. FIG. 6 shows schematically the whole structure of the second embodiment of the automatic inspection system for IC lead frames according to this invention. This embodiment is characterized in that the present invention automatic inspection system is placed after an automatic plating unit 244 which continuously plates IC lead frames 201 on the same line. The IC lead frames 201 which are the objects of inspection are supplied to the starting point on the conveyor line 203 by a loading unit 202 and placed thereon. They are conveyed on the conveyor line 203 to one of the inspection units 245 or a visual inspection unit 204 where they are inspected of their appearance. The products 246 rejected by this visual inspection are removed from the conveyor line 203 by a taking-out-device 205 being one of the rejected-product-taking-out unit 247 for rejected products. Those accepted by the visual inspection are advanced through the taking-out device 205. Then, a certain number of IC lead frames 201 are sampled out of a lot to be inspected of plating thickness by a plating thickness inspection unit 248. Both those rejected 250 and those accepted 249 are returned to the conveyor line 203 temporarily. When they reach a taking-out device 251 at an unloading unit 206, only accepted lead frames 249 are taken out by the device 251 from the conveyor line 203 and piled up for each lot on both sides of the line 203. When the finished goods thus accepted reach the number of one lot in the pile, they are packaged for each lot with rust-resistant paper by a package unit 252. Those rejected 250 are finally taken out of the line 203 by a taking-out device 253 at the terminal of the line 203.

The structures and operations of aforementioned units and devices will now be described. The loading unit 202 is provided at the starting point of the conveyor line 203 and comprises a pair of mounting tables 207a, 207b, and a chucking device 208 which takes out IC lead frames 201 from the mounting tables 207a, 207b. The conveyor line 203 comprises a plurality of feeding belt 210 each of which comprises two circular belts 209 suspended around two rollers respectively. The mounting tables 207a, 207b are placed on both sides of the feed belts 210 close to the input terminal of the conveyor line while the chucking device 208 is placed above them. The mounting tables 207a, 207b comprise respectively brackets 212 for vertical positioning and brackets 235 for lateral positioning which are erected on a base plate 211 so that IC lead frames 201 may be piled and kept thereon in a precise manner. A table 213 is provided on the bottom of the base plate 211 in a manner freely movable upward/downward by a cylinder 226 so that plural IC lead frames 201 piled on the table 213 are moved upward to the same height as the conveyor line 203 while the topmost lead frame is being inspected with a sensor 214.

The chucking device 208 comprises a supporting member 216 which is fixed at both ends with a belt 215 rotatable by a driving motor (not shown) so as to slide horizontally, and a chucking section 218 provided with a pair of chucking mechanisms 271a, 217b. The chucking section 218 is supported in a manner vertically movable in respect of the supporting member 216 by compact cylinders 219, and is slid upward/downward only when IC lead frames 201 are to be taken out and mounted (to be described later). Each of chucking mechanisms 217a, 271b is provided with a pair of chucking claws 220 respectively at both ends so that the topmost lead frame 201 may be held gently but firmly on sides with the claws 220 by the force of a spring 221, or the lead frame 201 may be released from the holding claws 220 when the claws are receded from each other against the force of the spring. As each of the lead frames 201 is gently held with such claws 220 on sides, handling is gentle enough to avoid new deformations and flaws which may otherwise be caused in inspection. Although not shown, there is provided at a position side of the lead frames 201 a device which prevents lead frames from being taken out in more than one member. The interval 200L$_1$ between the two chucking mechanisms 217a, 217b at the chucking device 218 is corresponded to the distance 200L$_2$ between each mounting tables 207a, 207b and the conveyor line 203. In other words, when the right chucking mechanisms 217a is corresponded to the right mounting table 207a, the left chucking mechanism 217b becomes aligned to the conveyor line 203 while when the left chucking mechanism 271b is corresponded to the left mounting table 207b, the right chucking mechanism 217a becomes aligned to the conveyor line 203. Accordingly, the operation of taking out an IC lead frame 201 from either the mounting table 207a or 207b by the chucking mechanisms 217a, 217b can be performed simultaneously to the operation of placing another IC lead frame 201 on the conveyor line 203 as the mechanisms can be slid both horizontally and vertically. This drastically enhances the efficiency as IC lead frames 201 can be taken out of the tables 207a, 207b and placed on the conveyor line 203 by alternating the mechanisms. The IC lead frames 201 thus placed on the conveyor line 203 are advanced to the next unit, the visual inspection unit 204.

The visual inspection unit 204 comprises a visual inspection unit main body 222 which inspects the appearance of each IC lead frame 201, pinch rollers 223, 224 which intermittently feed and take out IC lead frames 201, and a positioning mechanism 225 for IC lead frames. The visual inspection unit main body 222 inspects the appearance of each IC portion 200P which forms each IC lead frame 201 by picking up images on an IC lead frame 201 from the light reflected thereon with a TV camera 228 which integrally incorporates a light source cover 227, comparing and analyzing the images. The TV camera 228 is supported movably upward/downward on a guide shaft 229 and can be fixed at an arbitrary position with a lock lever 230.

There are provided pinch rollers 223 and takingout rollers 224 respectively at input side and output side of the measurement stage 200S of the camera 228. The pinch rollers 223, 224 are provided in pairs; one for upper side and the other for lower side. The belts 232 are suspended on the lower pinch rollers 223a, 224a. The belts 232 are revolved freely by plural roller groups including driving rollers 231. The upper pinch rollers 223b, 224b are structured and shaped in a manner only to contact the left side face of an IC lead frame 201 in order to protect the surface thereof. The reference numeral 243 denotes auxiliary rollers provided to secure the taking-out operation. IC lead frames 201 are intermittently advanced by the pinch rollers 223, 224 for each IC portion to set individual IC 200P at the measurement stage 200S sequentially.

When set on the stage 200S, IC lead frames 201 are further positioned by the positioning mechanism 225 having positioning pins 233, 234 which are placed below the stage 200S in a movable upward/downward manner. In other words, the positioning pins 233, 234 are inserted from below into small holes 236 bored serially on both sides of an IC lead frame 201 to accurately position the IC lead frame 201 on the stage 200S. This enables precise inspection of the appearance of each IC 200P.

After the visual inspection, IC lead frames 201 are placed again onto the conveyor line 203 from the pinch rollers 224 and conveyed to the taking-out device 205 for rejected products. The device 205 is provided with a chucking device 238 having two chucking mechanisms 237 similar to said loading unit 202. The device 205 for taking out the rejected products is actuated with the signals from said visual inspection unit 204, and only when it receives the signal indicating the presence of rejected products from the unit 204, it holds with the chucking claws 239 the defective products 201 on the conveyor line 203, slides them horizontally, and places them on the side of the line 203. The chucking device 238 has two chucking mechanism 237, but as products are seldom rejected, one chucking mechanisms 237 suffices. Even though rejected from the line, those rejected products are handled and stored very gently by the mechanism 237 in this invention method and therefore free of additional flaws and deformations which might otherwise be caused by socalled "kicking out" employed in the compressed air method or the revolving arm method. This is an advantage when rejected products are recycled.

These accepted products further advance past the taking-out-device 205 to the next stage, the plating thickness inspection unit 248. The reference numeral 254 denotes a plating thickness inspection unit main body, 255 a takingout device and 256 a device for returning the sample to the line. The taking-out device 255 and the device for returning 256 have chucking mechanisms 257, 258, one for each, and are reciprocally movable on only one side of the line respectively. The plating thickness inspection unit main body 254 is a non-destructive inspection unit which can measure the thickness of plating applied on lead frames by emitting radio active ray ($\beta$-ray) onto lead frames 201 and measuring the thickness of the plating out of the back-scattering thereof. Not all lead frames 201 are taken out from the conveyor line 203, but several are sampled from one lot. Sampled lead frames 201 are inspected by the plating thickness inspection unit 248, and are returned to the line 203 by the device 256 for returning.

When returned to the line 203 from the unit 248, lead frames 201 are further advanced to the next stage, the unloading unit 206. The reference numeral 251 denotes an accepted-product-taking-out device which has two chucking mechanisms 259 such as the loading unit 202 and which takes only the products which are judged acceptable at said plating thickness inspection unit 248 and piles them in the unit of lots on both sides of the line 203. If any one product in one sampled lot is judged unacceptable for the plated film thickness, the whole lot is judged unacceptable and rejected. The accepted products herein mean the lots of products any of which is not found unacceptable when sampled.

The IC lead frames 201 piled up in the unit of lots are therefore final products 249 which are acceptable for appearance and plating thickness, and are conveyed to the packaging unit 252 by a transporting means (not shown). In the packaging stage, IC lead frames 201 are packaged in the unit of a lot with rust resistant paper which is applied or impregnated with sulfide resisting agent or rust prevention agent. The plating (especially silver plating) on these lead frames 201 is sulfided and rusted (blackened) when exposed to the air. Such inconvenience may be prevented by packaging the IC lead frames with aforementioned anti-rust paper. The process for acceptable goods ends here.

The products 250 which are found unacceptable by the plating thickness inspection unit 248, on the other hand, have passed the taking-out device 251 on the conveyor line 203 by this stage, and are further carried on the line to the taking-out device 253 at the output terminal having the same structure as the loading unit 202 where they are taken out of the line 203 to be stored on both sides thereof. The rejected products are handled one by one gently by the chucking mechanism 260 of the device 253 to prevent injuries thereto, and therefore can be recycled.

The order and positional relation among the inspection units such as the visual inspection unit 204, and the plating thickness inspection unit 248 on the conveyor line 203 are not limited to those described above, but may be contrary to the above; i.e. the plating thickness inspection unit 248 may be placed in front of the visual inspection unit 204.

Figure 11:
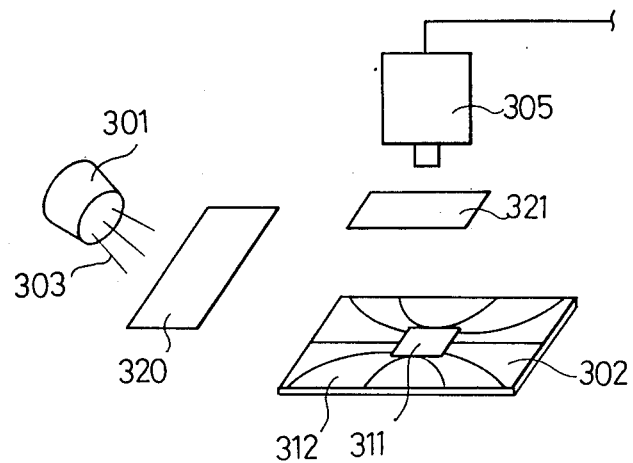
FIG. 11 is a schematic perspective view to show essential parts in the visual inspection unit.
Figure 12:
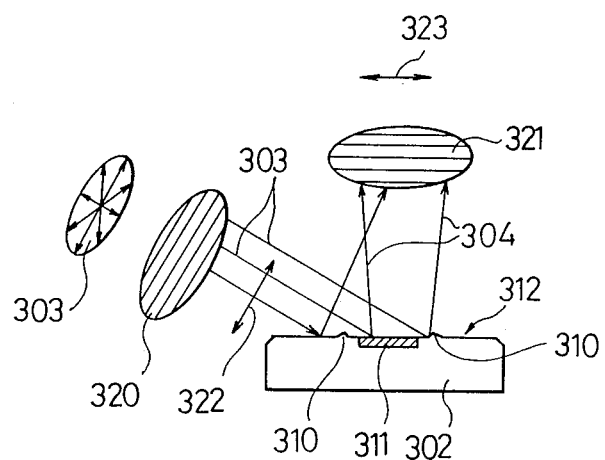
FIG. 12 is an explanatory view of the performance of the above visual inspection unit.

One embodiment of the visual inspection unit will now be described by referring to FIGS. 11 and 12. In this embodiment, the first and second polarizing filters 320, 321 are placed between a light source 301 and an IC lead frame 302, and betweeen the IC lead frame 302 and a TV camera 305. The filter 320 between the light source 301 and the lead frame 302 is adapted to pass only one directional light 322 (i.e. either horizontal or vertical light); in this embodiment, it only passes vertical light.

The second filter 321 between the lead frame 302 and the TV camera 305 passes the light 323 which crosses perpendicularly the light 322 passing through the first polarizing filter 320 (in the figure, horizontal light).

This invention system will be used under the following conditions:

Irradiation of light onto IC lead frames 302:

When light 303 is irradiated from the light source 301 onto a lead frame 302, "the natural light" is polarized by the polarizing filter 320 to become the vertical light 322. When the vertical light 322 is irradiated on the lead frame 302, the light 304 reflected therefrom becomes mainly the vertical light 322.

Light received by TV camera 305:

When the vertical light 322 is reflected from the lead frames 302, the light reflected from the plated portion 311 becomes diffusedly reflected as well as refracted deviating in azimuth angle due to the presence of crystals of plated metal (not shown) while the light reflected from other portions is the normal reflected light 304 to be inputted at the TV camera 305. This inventor empirically knew that even if the light 303 is irradiated onto an irregularity 310, if the light is vertical, diffused reflection and refraction would not occur at the irregular portion 310 unlike the light irradiated onto the plated portion 311, but the light reflected is the normally reflected light without causing deviation in azimuth angle. Accordingly, when the reflected light 304 is passed through the second filter 321 placed between the IC lead frames 302 and the TV camera 305, as the second polarizing filter 321 passes only the horizontal light 323, only the light reflected from the plated portion which is diffusedly reflected and refracted with deviation in azimuth angle can pass through the filter while the normally reflected light from the irregular portion 310 is blocked by the filter 321. Therefore, no excess light will be inputted at the TV camera 305.

By arranging in combination one polarizing filter which passes only one directional light; i.e. either horizontal or vertical light, and another polarizing filter which passes only the light which perpendicularly crosses the first light at "the output side" of the light source 301, (more concretely between the light source 301 and the lead frame 302) and at "the input side" of the TV camera 305 (more concretely between) the lead frames 302 and the TV camera 305), this invention system enables the light 304 reflected from the plated portion 311 to be inputted at the TV camera 305 so that plated portion 311 can be distinctly distinguished from non-plated portions 312 in the density on a video monitor.

According to the above embodiment of this invention, IC lead frames are irradiated only with the one directional light, and therefore diffused reflection seldom occurs, and even if irregular portions exits on the lead frame to reflect additional light toward the TV camera, the additional or unnecessary light would be shielded by the polarizing filter placed at the input side of the camera, and only the light which is diffusedly reflected and refracted from the plated portion is inputted at the camera. Therefore, the plated portion and unplated portions are clearly distinguished from each other by the density on a video monitor to thereby further enhance the precision in the overall inspections of IC lead frames.

Figure 13:
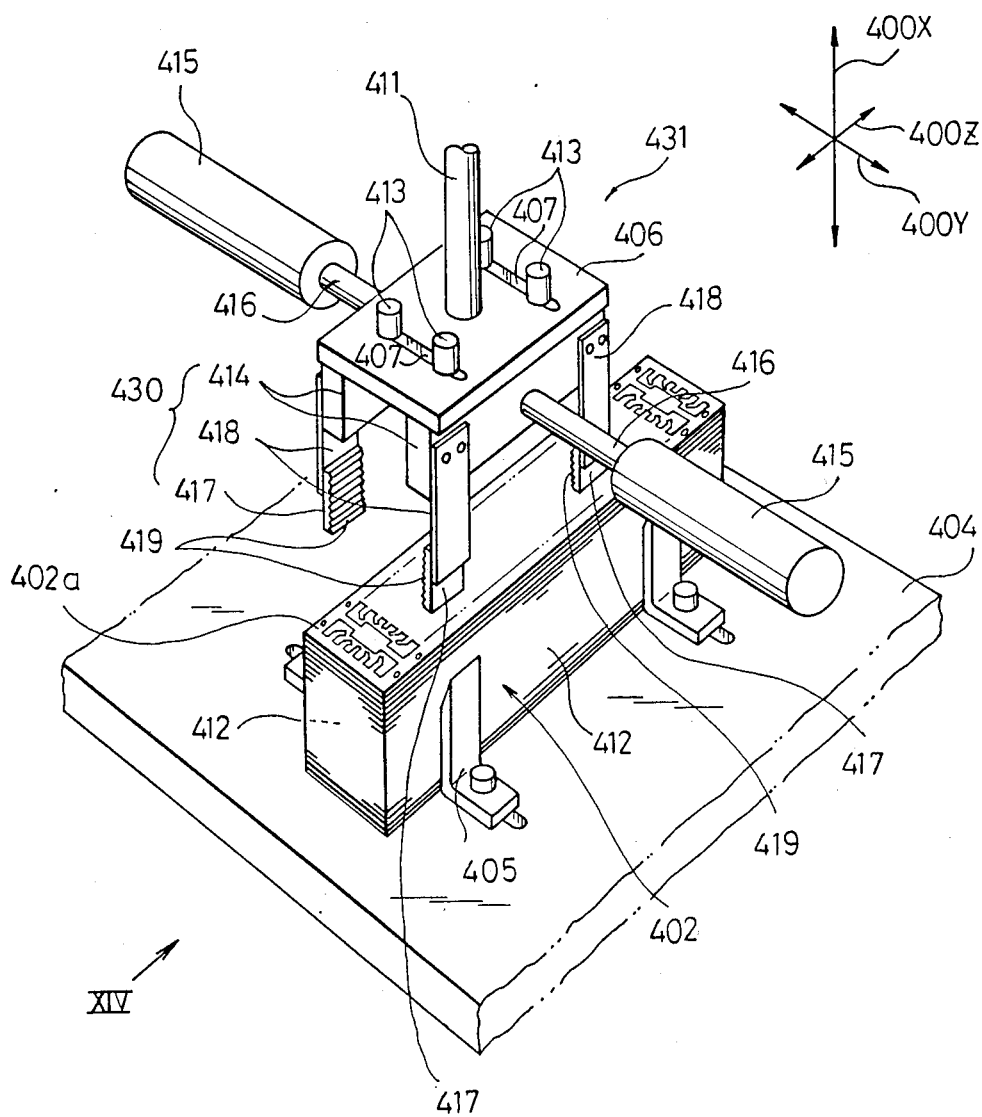
FIG. 13 is a perspective view of a chucking device within the loading unit in another embodiment.
Figure 14:
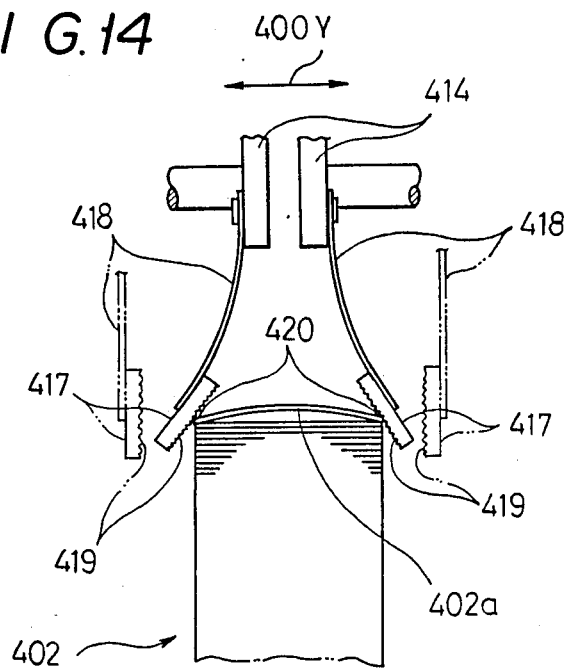
FIG. 14 is a side view when viewed from the arrow XIV in FIG. 13.

Another embodiment of the loading unit to be used in this invention automatic inspection system for IC lead frames will now be described by referring to FIGS. 13 and 14. (Refer to the reference numeral 102 in FIG. 1 and the reference numeral 202 in FIG. 7).

This embodiment is characterized by the chucking unit which is one component of the loading unit, and more particularly by chucking claws 430 and chucking mechanisms 431 therein.

The chucking claws 430 have a pair of holder plates 414 and plural claw members 417 while the chucking mechanisms 431 comprises transporting means including air cylinders 415 which make both holder plates 414 approach to each other in order to abut opposing surfaces of the claw members 417 onto an IC lead frame 402 at the corresponding line. IC lead frames 402 are piled on plural number on a mounting base 404 under the condition that both side surfaces 412, 412 thereof are held by the holder 405. The mounting base 404 is movable vertically by air cylinders (not shown) so that the topmost lead frame 402a is constantly kept at the same height.

At the center of a supporting plate 406 is connected a shaft 411 of the air cylinder (not shown) which is movable in three directions; i.e. the directions indicated by an arrow 400Y, an arrow 400Z and an arrow 400X. The supporting plate 406 is further provided with two elongated guide holes 407 in parallel. A pair of holder plates 414 are attached beneath each supporting plate 406 with guide pins 413 which can move within the guide holes 407. Shafts 416 of the air cylinders 415 are connected at the center of the outer side faces of the holder plates 414 in a manner movable in the horizontal direction. In other words, both holder plates 414 can approach and recede from each other as the shafts 416, 416 move horizontally. Air cylinders (not shown) connected to the supporting plate 406 and air cylinders 415 connected to both holder plates 414 are attached to and supported by a moving mechanism (not shown) in a manner movable in three directions.

Four claws 417 are suspended from outer side surfaces of the holder plates 414 via plate springs 418 and are paired. Claws 417 are to hold an IC lead frame 402 from both sides and the surfaces 419 of the claws 417 which oppose each other are finished rough to secure the upper edges 420 of the topmost IC lead frame 402a.

Description will now be given in relation to operation.

The supporting plate 406 is positioned by a moving mechanism (not shown) immediately above the topmost sheet of the IC lead frames 402 piled up in a plural number. By this time, both holder plates 414 are receded from each other to have the interval larger than the width of an IC lead frame 402. Claws 417 on the supporting plate 406 are lowered by the shaft 411 of the air cylinders (not shown) to position opposing rough surfaces 419 of the claws 417 at the height equal to both sides 421 of the topmost IC lead frame 402a. Then both of the holder plates 414 are approached to each other by the air cylinders 415 to narrow the distance between rough surfaces 419 of the opposing claws 417. The holder plates 414 with claws 417 thereof further approach each other by the air cylinders 415 to come to abut onto the side surfaces 412 of the lead frame 402 with the rough surfaces 419 thereof. Both holder plates 414 are still pressed toward each other even after they abut against the sides of the lead frame, the plate springs 418 are compressed and the rough surfaces 419 of claws 417 abut against the topmost lead frame at corresponding lines and tightly hold it therebetween from both sides (see FIG. 14). The topmost lead frame 402a is kept held as it is with the spring force of deformed plate springs 418 and the friction caused between the rough surfaces 419 of claws 417 and the upper edges 420. When the movement of the holder plates 414 is suspended under this condition, the supporting plate 406 with all the other components is raised upward, laterally or horizontally, to take out and convey the topmost sheet 402a of the IC lead frames 402 out of the pile.

After conveying the supporting plate 406 with other members to a predetermined position, the holder plates 414 are receded from each other, and the topmost sheet 402a of the IC lead frames can be transported to a predetermined position (e.g. on the conveyor belt).

Although the number of the claws 417 attached to the holder plates 414 via plate springs 418 is four (in front and rectal pairs), the number of the claws and the width of the rough surface may be determined otherwise depending on the longitudinal size of an IC lead frame 402. The rough surfaces 419 may not be serrated, but may be double-cut surfaces, or formed with a sheet of sandpaper pasted thereon.

Figure 15:
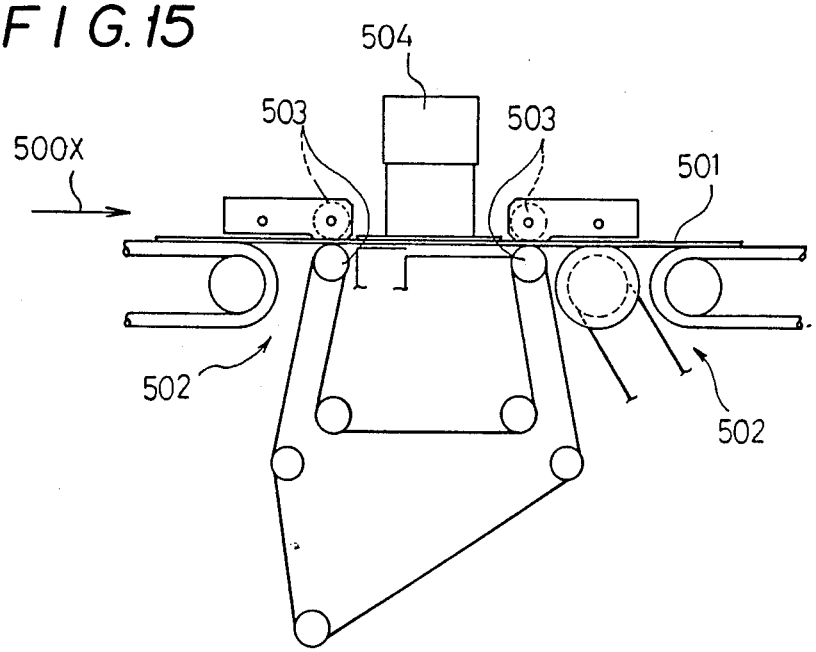
FIG. 15 is a schematic side view of the visual inspection unit which is used with the visual inspection method for IC lead frames.
Figure 16:
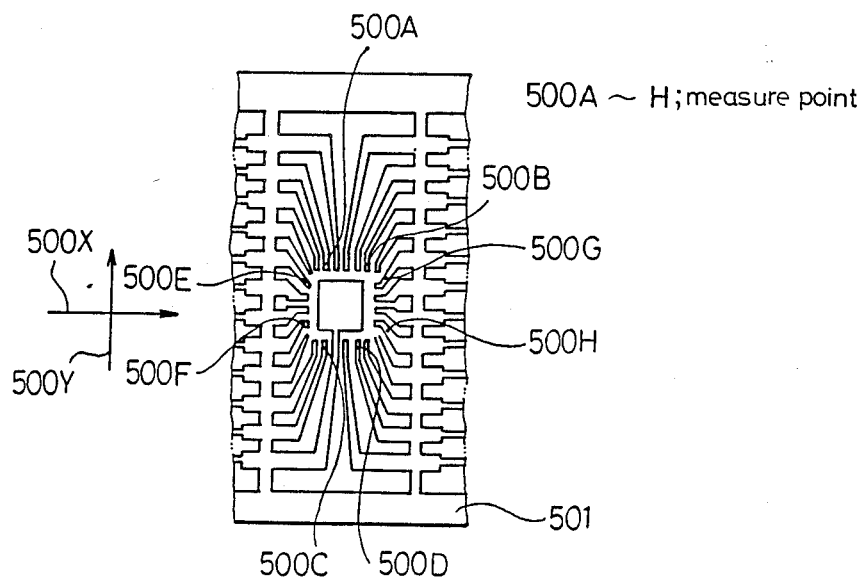
FIG. 16 is a schematic plan view of an IC lead frame.

Another example of the IC lead frame visual inspection method of this invention will now be described referring to FIGS. 15 and 16 which show embodiments of the units to be used by the method.

According to this method, the IC portion of an IC lead frame 501 is first positioned in the normal state in relation to an inspection camera 504 to be measured at plural points, and the image thereof is stored in memory. This stored image is used as the reference which is compared with input images from IC portions of other IC lead frames 501 which are successively conveyed, positioned and measured at the points 500A through 500H. If there are errors in the conveyed position to cause mismatching between input images and the reference image, the misalignment will be corrected by an electric means. After having input images aligned with the reference image, individual input image is inspected. The discovered misalignment in position will be fed back to the conveyor unit 502 is normalize it. As inspection is conducted at plural points, and the average values at these points are compared to the reference value, errors in measurements will be minimized even if there is a defect at any measurement point. As errors in positioning mainly occur in the direction of conveyor (or the direction indicated by an arrow 500X), the measurement points 500E~500H in the direction perpendicular thereto (or the direction indicated by an arrow 500Y) may be omitted.

As described above, this invention method can prevent accumulation of errors even if conveying/positioning operations are repeated to minimize the possibility that positioning errors of the magnitude beyond tolerance occur as this method comprises the steps of comparing input images of individual lead frames newly positioned with the reference image which is stored at the normal position, detecting the errors if any in conveyance or positioning out of the mismatching between the above two images, and feeding back the errors to the conveyor unit to normalize it. Even if there is an error, input images will be matched with the reference image by an electric means before inspection to secure precise and accurate inspection. As this method can allow mechanical errors in conveyor/positioning mechanism to a certain extent by its characteristic arrangement, it does not need a positioning mechanism 225 including positioning pins 233, 234 shown in FIG. 10 which used to be required in the prior art to enhance the speed of the inspection. The reference numeral 503 denotes pinch rollers.

Another visual inspection method for IC lead frames will now be described.

This method inspects the appearance of an IC lead frame by comparing the luminance curve of an input IC lead frame with the stored reference luminance curve of the reference IC lead frame which is model-plated in advance in the shapes of the curves which are complicatedly formed depending on signals and plated conditions of the inspected areas of lead frames.

There have been known various methods as this type visual inspection method for IC lead frames, but they are based on the following principle.

The reference luminance curve is determined by measuring a model-plated IC lead frame, and stored in memory. When inspecting individual lead frames, the luminance curve for an individual lead frame is measured and inputted to be compared with the reference luminance curve in signals which are characterized by complicated shapes, fluctuation and plated conditions of an plated area. More specifically, if there is a deviation in the curve of the signals of an input lead frame from the signals of the reference curve, the area with the signals different from the reference will be detected as defects in plating.

If gloss of IC lead frames slightly differs depending on the types of additives contained in plating solutions, the amount of reflected light in total change to thereby fluctuate individual luminance curves as a whole. If the individual luminance curve as it is is compared with the reference luminance curve, the changes due to the reflected light change are detected as plating defect rather than the simple difference in shapes of signals to greatly hamper the reliability in inspection.

This invention method therefore removes the difference caused between an input lead frame and the reference plated lead frame due to the gloss condition rather than the defective plating so as to guarantee precise inspection by the following means.

If there is mismatching between an input luminance curve and the reference luminance curve which is suspected to occur due to the gloss on the plated surface of an input lead frame, the mismatching is removed by electrically processing either the reference curve or the individual curve to match the two curves so as to enable proper comparison for the shapes of the curves.

This constantly ensures precise and proper inspection of lead frames as the comparison is made only in respect of complicated shapes of the curves caused by the difference of the plates conditions rather than the gloss conditions.

Figure 17:
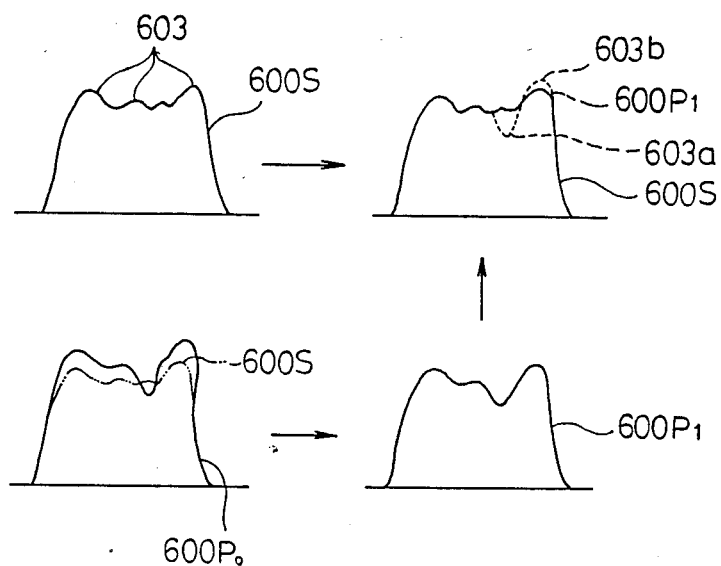
FIG. 17 illustrates explanatory graphs to show the relation between the reference luminance curve and individual luminance curves obtained by this invention visual inspection method for IC lead frames.

An embodiment of this method will be described by referring to FIG. 17. When total but similar differences exist between the reference luminance curve 600S and an input luminance curve $600P_0$ due to the gloss in plating conditions of inspected lead frames, the curve $600P_0$ is electrically processed to be individual luminance curve $600P_1$ and to be matched with the reference curve 600S. After matching the overall forms of the two curves, signals at 603, 603a and 603b of the curves 600S and $600P_1$ are compared to detect plating defects. The reference numerals 603a, 603b denote signals which indicate deviation from the signal 603 on the reference curve 600S to be detected as the defects in plating. The reference luminance curve 600S may be electrically processed to coincide with the curve $600P_0$ instead of the curve $600P_0$.

This invention therefore can remove differences in signals of an inspected lead frame from the reference plated lead frame caused due to gloss conditions rather than the plating conditions to thereby secure proper and precise inspection of plated conditions.

Still another inspection method for appearance of IC lead frames will now be described. This method comprises the steps of measuring the reflectivity of the light reflected from an object area of the surface of an inspected IC lead frame with an image sensor, measuring the area of each object area by means of the reflectivity to obtain the correlation therebetween, and comparing thus obtained individual correlation with the reference correlation.

As this invention method can obtain the correlation of reflectivity of an inspected area and the area size corresponding thereto, it can measure not only plating defects but also the distribution of plating film thickness and dimensions of the plated IC lead frames. This invention method can inspect the conditions of an IC lead frame simultaneously and multifacetedly.

Figure 18:
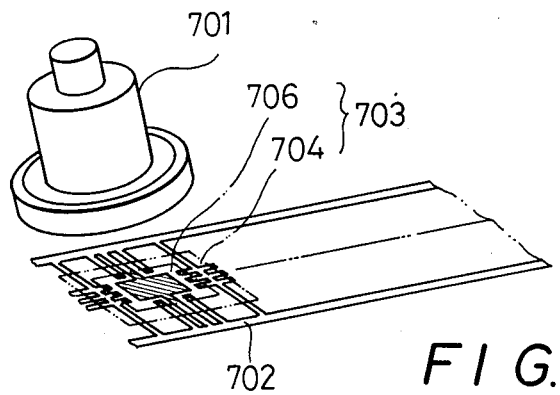
FIG. 18 is a schematic view of the relation between an image sensor and a plated object to be used in an embodiment of this invention.
Figure 19:
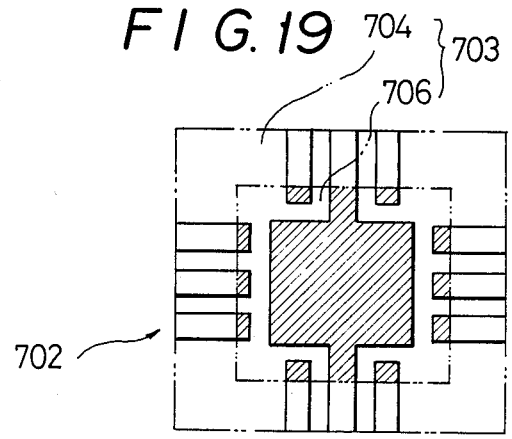
FIG. 19 is a schematic plan view to show the scope of inspection on a plated sample.
Figure 20:
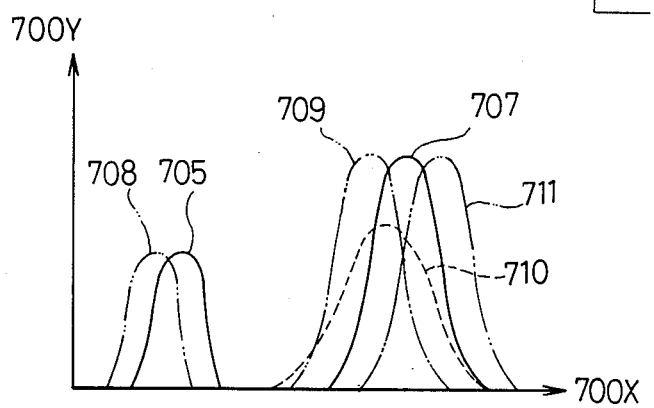
FIG. 20 are correlation graphs to show the relation between light reflectivity and an area corresponding thereto.

Another embodiment of this invention inspection method will now be described referring to FIGS. 18 through 20.

According to this visual inspection method for plated products, reflectivity 700X of the light reflected from an area of the surface 703 of an object of inspection (an IC lead frame 702) and the area size 700Y of each inspected area corresponding to the reflectivity 700X are measured by an image sensor 701, and simultaneously the correlation therebetween is calculated. Thus obtained correlation is compared with "the reference correlation" initially set on a model-plated IC lead frame 702. More particularly, the correlation between the reflectivity 700X and the area 700Y of the object of inspection is obtained in the form of a correlation curve to be compared with the reference correlation curve which is initially set on the model-plated IC lead frame 702. For instance, if an abnormality exists on a plated or non-plated area of an object, such that the non-plated area 706 is rusted, plated area 706 is sulfied, or plated area 706 is attached with a foreign object or stained with a finger-mark, then the individual correlation curves 708, 709, 710, 711 become deviated from the reference correlation curve 705 for the non-plated area 704 and the reference correlation curve 707 for the plated area 706 as shown in FIG. 20. The appearance of an IC lead frame as well as distribution of plated film thickness can be inspected by the degree of deviation. Further, the dimension of an IC lead frame 702 may be detected from the area encircled by the correlation curve.

This invention method can therefore inspect not only plating defects by the light reflectivity but also the distribution of plated film thickness, and dimension of plated area in simultaneous and multifaceted fashion. Even if the reflectivity itself changes due to chronological changes of the illumination light or the external scattering light, the method can inspect the plated conditions irrespective of the influence from such change by referring to the relation between the reference correlation curve 705 of non-plated area 704 and the reference correlation curve 707 of plated area 706 (for instance, the difference between reference correlation curves 705 and 707 in peak light reflectivities).

Although the correlation is expressed by correlation curves in this embodiment, it may be represented in figures.

This invention method is highly effective as it can inspect not only the plating defects from the light reflectivity but also the distribution of plated film thickness and dimension of plated area from measured area to thereby achieve multifaceted inspection of plated objects by obtaining correlation between reflectivity of an area on the surface of an area and the size of the corresponding area.

What is claimed is:

1. An automatic inspection system for IC lead frames, comprising: an inspection line having an input terminal and comprising a visual inspection unit, a shape inspection unit, a loading unit adapted to transfer one IC lead frame at a time from a pile thereof to said input terminal of the inspection line, and unloading means responsive to signals from said visual inspection unit or said shape inspection unit for taking out accepted or rejected IC lead frames from the inspection line;

said visual inspection unit comprising an illumination means which emits light on a first test IC lead frame which is being inspected at said visual inspection unit, and TV camera adapted to provide a test image indicative of the patterned shape and appearance of said first test IC lead frame out of the light reflected therefrom, and including evaluation means to compare and analyze said test image with a reference image indicative of the patterned shape and appearance of an acceptable IC lead frame and to inspect the patterned shape and appearance of said test IC lead frame; and said shape inspection unit comprising at least a pair of conductive cases adapted to hold a second test IC lead frame being inspected in said shape inspection unit on both sides and conductive contacts which are provided within and are electrically insulated from both said cases and adapted to be maintained at a small distance from the surface of a reference, acceptably shaped IC lead frame when said acceptably shaped IC lead frame is held by said cases, so that deformation of said second test IC lead frame can be detected by electric connection/disconnection between said second test IC lead frame, said cases and said contacts when said second test IC lead frame is held by said cases or said contacts.

2. An automatic inspection system for IC lead frames having small holes therethrough, comprising: an inspection line comprising a conveyor having an input end and a discharge end and inspection units in association with said conveyor, a loading unit for loading IC lead frames on said input end of said conveyor; a taking-out unit for removing rejected products, and an unloading unit on said inspection line;

wherein said loading unit includes a pair of mounting base units on opposite sides of said input end of said conveyor and elevating cylinders which move upwardly stacks of IC lead frames piled up thereon to maintain them at a specific height, and chucking means for picking up the topmost IC lead frame from the stacks on the mounting base units alternately, said chucking means including a pair of chucking mechanisms which can move horizontally and vertically, each said chucking mechanism including chucking claws adapted to hold a respective IC lead frame from both sides;

wherein at least one of said inspection units is a visual inspection unit comprising a TV camera adapted to provide a test image out of the light reflected from a first test IC lead frame which is being inspected at said one visual inspection unit, and evaluation means for comparing and analyzing the test image with a reference image indicative of the patterned shape and appearance of an acceptable IC lead frame to detect the appearance of the first test IC lead frame, said visual inspection unit including pinch rollers adapted to intermittently feed each IC lead frame to said visual inspection unit, and a positioning mechanism adapted to precisely position each IC lead frame in said visual inspection unit, said positioning mechanism comprising positioning pins and means for moving said positioning pins from underneath the test IC lead frame into said small holes of the first rest IC lead frame;

wherein at least one said inspection units is a plating thickness inspection unit of the non-destructive type the adapted to measure the plating thickness of the IC lead frame, and including measuring means for irradiating radio-active rays onto a second test IC lead frame undergoing inspection at said plating thickness inspection unit and measuring back-scattering thereof;

wherein said rejected-product-taking-out unit comprises first taking-out means for removing IC lead frames rejected on account of appearance from said conveyor line and secnd taking-out means for removing IC lead frames rejected on account of plating thickness from said conveyor line, said first and second taking-out means each including a chucking mechanism which can move horizontally and vertically and having chucking jaws adapted to hold an IC lead frame on both sides, and being operable to remove IC lead frames from the inspection line with said chucking mechanisms when the IC lead frames are rejected by either visual inspection or plating thickness inspection, said first and second taking-out means being responsive to signals from either the visual inspection unit or the plating thickness inspection unit; and wherein said unloading unit comprises an unloading device adapted to remove accepted IC lead frames from said conveyor and being further adapted to take out accepted IC lead frames which arrive on said conveyor and pile them in lots on both sides of said conveyor, and a packaging device which wraps said lots of accepted IC lead frames with rust-resistant paper.

3. A visual inspection method for IC lead frames comprising the steps of:

providing a reference correlation of reflectivity versus area for a model-plated IC lead frame;

measuring reflectivities of the light reflected from respective surfaces of a test IC lead frame depending on the conditions thereof and simultaneously measuring the area size of the object area corresponding to the reflectivity to obtain a test correlation therebetween for said test IC lead frame; and comparing said reference correlation and said test correlation for determining plating defects, distribution of plating film thickness and dimensions of said test IC lead frame.

4. An automatic inspection system for IC lead frames, comprising: an inspection line having an input end and a discharge end, and comprising first and second visual inspection units; a loading unit for transferring IC lead frames, one at a time, from a pile of said IC lead frames onto said input end of said inspection line; an unloading unit for separately removing (1) accepted IC lead frames and (2) rejected IC lead frames, from the said discharge end of said inspection line in response to signals from said first visual inspection unit or said second visual inspection unit, said first visual inspection unit comprising first illumination means for directing light onto a surface of an IC lead frame undergoing inspection at said first visual inspection unit, a first TV camera for viewing said surface of said IC lead frame undergoing inspection and providing a first, electronic test image indicative of the pattern on said surface, and a first image inspection device for comparing said first test image from said surface with a first electronic reference image indicative of the pattern on an acceptable IC lead frame, and discriminating between IC lead frames having acceptable patterns and IC lead frames having defective patterns; said second visual inspection unit comprising a second illumination means for directing light onto a surface of an IC lead frame undergoing inspection at said second visual inspection unit, a second TV camera for viewing said surface of said IC lead frame undergoing inspection at said second visual inspection unit and providing a second electronic test image indicative of the appearance of said surface, and a second image inspection device for comparing said second test image with a second electronic reference image indicative of the appearance of the surface of an acceptable IC lead frame, and discriminating between IC lead frames having an acceptable appearance and IC lead frames having a defective appearance.

5. The automatic inspection unit for IC lead frames as claimed in claim 4 in which said first and second visual inspection units each include a first polarizing filter which passes only one directional light and is arranged between said light source and said test IC lead frame, and a second polarizing filter which passes only one directional light perpendicular to the light passing through the first filter and is arranged between said test IC lead frame and said TV camera.

6. The automatic inspection system for IC lead frames claimed in claim 4 in which said loading unit includes chucking units comprising chucking claws and chucking mechanisms, said chucking claws comprising a pair of holder plates which are positioned above the pile of IC lead frames, at least one pair of claw members suspended from said holder plates by plate springs so that said claw members oppose each other, said chucking mechanism including a transporting means for causing said holder plates to approach each other to engage and hold the edges of the topmost IC lead frame with the opposing surfaces thereof, so that the topmost IC lead frame can be taken out separately.

7. An automatic inspection unit for IC lead frames having small holes therethrough, comprising: an inspection line comprising a conveyor having an input end and a discharge end and inspection unit means in association with said conveyor; a loading unit for transferring IC lead frames onto said input end of said conveyor, said loading unit comprising a pair of mounting base units on opposite sides of said conveyor, each of said mounting base units being adapted to support a stack of IC lead frames and having an elevating cylinder coupled thereto for raising said mounting base unit to maintain the uppermost IC lead frame of the stack at a selected position with respect to said conveyor, said loading unit comprising chucking means having chucking claws for picking up the uppermost IC lead frame of each of said stacks alternately and depositing it on said input end of said conveyor; said inspection unit means comprising a visual inspection unit comprising illumination means for directing light onto a surface of an IC lead frame undergoing inspection at said visual inspection unit, a TV camera for viewing the surface of said IC lead frame undergoing inspection and providing an electronic test image so that the appearance of said surface can be compared and analyzed and accepted IC lead frames having acceptable patterns can be differentiated from rejected IC lead frames having defective patterns, pinch rollers for intermittently feeding IC lead frames to said visual inspection unit, positioning pins receivable in the holes of an IC lead frame undergoing inspection at said visual inspection unit to precisely position said IC lead frame with respect to said TV camera; a first discharge unit for taking out rejected IC lead frames in response to signals from said inspection unit means; and an unloading unit for taking out accepted IC lead frames in response to signals from said inspection unit means, said unloading unit comprising means for forming stacks of accepted IC lead frames on both sides of said conveyor, and a packaging device for wrapping stacks comprising a selected number of accepted lead frames in anti-rust paper.

8. The automatic inspection unit for IC lead frames as claimed in claim 7 in which said visual inspection unit includes a first polarizing filter, which passes only one directional light is arranged between said light source and the IC lead frame, and a second polarizing filter, which passes only one directional light perpendicular to the above light passing through the first filter, is arranged between said test IC lead frame and said TV camera.

9. The automatic inspection system for IC lead frames claimed in claim 7 in which in that said loading unit includes chucking units comprising chucking claws and chucking mechanisms, said chucking claws comprising a pair of holder plates which are positioned above the pile of IC lead frames, at least one pair of claw members suspended from said holder plates by plate springs so that said claw members oppose each other, said chucking mechanism including a transporting means for causing said holder plates to approach each other to engage and hold the edges of the topmost IC lead frame with the opposing surfaces thereof, so that the topmost IC lead frame can be taken out separately.

10. A visual inspection method for elongated, test, IC lead frames, each IC lead frame being comprised of a plurality of IC portions, which portions are connected in side-by-side relation along the lengthwise extent of said lead frame, each IC portion including an island member and an inner lead, which comprises the steps of: storing an electronic reference image indicative of the pattern of the surface of a reference IC portion of an acceptable reference IC lead frame which reference IC portion is precisely positioned with respect to an inspection TV camera at an inspection station, said positioning being based on measurements made at plural positioning points on the surface of said reference IC portion; intermittently sequentially unidirectionally advancing IC lead frames in said lengthwise direction along a conveyor through said inspection station so that said IC portions are presented for inspection at said station in succession; at said inspection station, viewing with said TV camera the surface of the test IC portion undergoing inspection and providing an electronic test image indicative of the pattern of said surface of said test IC portion, comparing said test image with said reference image and, if the portions of said test image corresponding to said positioning points do not match those of said reference image, adjusting said test image so that the portions thereof corresponding to said positioning points on the surface of said test IC portion match the portions of said reference image corresponding to the positioning points on the surface of said reference IC portion, feeding back to said conveyor information of the mismatch between said test image and said reference image and adjusting the operation of said conveyor in order to remove the mismatch between said test image and said reference image.

11. A visual inspection method for inspecting the plating of an IC lead frame, comprising the steps of:
 providing the reference luminance curve for a model-plated IC lead frame;
 providing the test luminance curve for a test IC lead frame;
 electrically processing at least one of said luminance curves to eliminate from said curves the effect of the differences of the gloss of the platings on the model-plated IC lead frames and the test IC lead frame; and
 comparing said curves to determine whether said test IC lead frame exhibits a plating defect.

* * * * *

UNITED STATES PATENT AND TRADEMARK OFFICE
CERTIFICATE OF CORRECTION

PATENT NO. : 4 851 902
DATED : July 25, 1989
INVENTOR(S) : Junichi TEZUKA et al

It is certified that error appears in the above-identified patent and that said Letters Patent is hereby corrected as shown below:

Column 15, line 29; after "and" insert ---a---.
Column 16, line 21; change "rest" to ---test---.
            line 24; delete "the" (first occurrence only).
            line 25; change "frame," to ---frames,---.
            line 33; change "secnd" to ---second---.
Column 20, line 12; change "frames" to ---frame---.

Signed and Sealed this

Twenty-first Day of August, 1990

Attest:

HARRY F. MANBECK, JR.

Attesting Officer         Commissioner of Patents and Trademarks